(12) United States Patent
Moon et al.

(10) Patent No.: US 12,306,358 B2
(45) Date of Patent: May 20, 2025

(54) RADIATION INSPECTION APPARATUS INCLUDING A RADIATION DETECTOR COMPRISING A RADIATION DETECTING PANEL, A BENDING SUPPORT UNIT, AND A BENDING ADJUSTMENT UNIT

(71) Applicant: DRTECH CORP, Seongnam-Si (KR)

(72) Inventors: Beom Jin Moon, Suwon-si (KR);
Hyeong Sik Kim, Hwaseong-si (KR);
Nam Won Kim, Gwangju-si (KR);
Yong Cheol Gil, Seongnam-si (KR)

(73) Assignee: DRTECH CORP (KR)

( * ) Notice: Subject to any disclaimer, the term of this patent is extended or adjusted under 35 U.S.C. 154(b) by 0 days.

(21) Appl. No.: 18/011,523

(22) PCT Filed: May 3, 2022

(86) PCT No.: PCT/KR2022/006353
§ 371 (c)(1),
(2) Date: Dec. 19, 2022

(87) PCT Pub. No.: WO2022/265225
PCT Pub. Date: Dec. 22, 2022

(65) Prior Publication Data
US 2024/0134072 A1  Apr. 25, 2024
US 2024/0230933 A9  Jul. 11, 2024

(30) Foreign Application Priority Data

Jun. 15, 2021  (KR) .................. 10-2021-0077592
Sep. 8, 2021  (KR) .................. 10-2021-0119955

(51) Int. Cl.
*G01N 23/04*  (2018.01)
*G01N 23/18*  (2018.01)
*G01T 1/24*  (2006.01)

(52) U.S. Cl.
CPC ............. *G01T 1/244* (2013.01); *G01N 23/04* (2013.01); *G01N 23/18* (2013.01)

(58) Field of Classification Search
CPC .... G01N 23/04; G01N 23/043; G01N 23/046; G01N 23/083; G01N 23/087;
(Continued)

(56) References Cited

U.S. PATENT DOCUMENTS 6,583,420 B1 * 6/2003 Nelson ................. A61B 6/4258
250/397
6,823,039 B2 * 11/2004 Hoheisel .............. A61B 6/4417
378/19
(Continued)

FOREIGN PATENT DOCUMENTS

JP  2003060186 A  2/2003
JP  2003070776 A  3/2003
(Continued)

OTHER PUBLICATIONS

Written Opinion for PCT/KR2022/006353 mailed Jul. 20, 2022.
European Extended Search Report for Application No. 22821835.0, mailed Mar. 18, 2025.

*Primary Examiner* — Allen C. Ho
(74) *Attorney, Agent, or Firm* — Renaissance IP Law Group LLP

(57) ABSTRACT

The present inventive concept relates to: a radiation detector including a bendable radiation detecting panel and a radiation inspection apparatus including same. The radiation detector includes: a radiation detecting panel which is flexible, extending in a first direction, and detecting radiation incident to a first face; and a bending support unit which is plate-shaped, provided on a second face of the radiation detecting panel opposite to the first face to support the radiation detecting panel, and having a flexibility. The (Continued)

flexibility of the bending support unit is less than a flexibility of the radiation detecting panel.

17 Claims, 8 Drawing Sheets

(58) Field of Classification Search
CPC ...... G01N 23/10; G01N 23/18; G01T 1/2018; G01T 1/20182; G01T 1/20185; G01T 1/20186; G01T 1/20188; G01T 1/24; G01T 1/243; G01T 1/244; A61B 6/42; A61B 6/4208; A61B 6/4233; A61B 6/4241; A61B 6/425; A61B 6/4258; A61B 6/4266; A61B 6/4275; A61B 6/4283; A61B 6/4291
USPC ....... 250/370.09; 378/10, 19, 53, 54, 57, 58, 378/98.8, 189
See application file for complete search history.

(56) References Cited

U.S. PATENT DOCUMENTS

| | | | | |
|---|---|---|---|---|
| 6,856,670 B2* | 2/2005 | Hoheisel | ............... | G01T 1/2018 257/E27.14 |
| 6,982,424 B2* | 1/2006 | Vafi | ....................... | G01T 1/2018 250/370.11 |
| 6,990,176 B2* | 1/2006 | Sherman | ............... | A61B 6/4411 378/161 |
| 7,078,702 B2* | 7/2006 | Ringermacher | .. | H01L 27/14601 250/363.02 |
| 7,117,588 B2* | 10/2006 | Vafi | ................... | H01L 27/14658 250/370.09 |
| 7,235,790 B2* | 6/2007 | Hoge | ................ | H01L 27/14658 250/370.11 |
| 7,521,685 B2* | 4/2009 | Hennessy | ............ | G01T 1/20189 250/361 R |
| 7,525,097 B2* | 4/2009 | Dorscheid | ............ | A61B 6/4291 250/370.11 |
| 7,563,026 B2* | 7/2009 | Mandelkern | ......... | A61B 6/4233 378/189 |
| 8,173,969 B2* | 5/2012 | Nishino | ............... | A61B 6/4494 250/370.08 |
| 8,803,101 B2* | 8/2014 | Kaneko | ................... | G01T 1/202 250/370.11 |
| 8,859,974 B2* | 10/2014 | Tsukerman | ............ | A61B 6/037 250/363.05 |
| 8,861,680 B2* | 10/2014 | Iwakiri | ................... | G03B 42/04 378/189 |
| 9,322,930 B2* | 4/2016 | Schellenberg | ......... | G01T 1/1642 |
| 10,236,091 B2* | 3/2019 | Baturin | .................... | G01T 1/244 |
| 10,825,855 B2* | 11/2020 | Bert | .................... | H01L 27/14663 |
| 10,959,690 B2* | 3/2021 | Wojcik | .................. | A61B 6/4233 |
| 11,061,153 B2* | 7/2021 | Jadrich | ............... | G01T 1/20189 |
| 11,195,874 B2* | 12/2021 | Wojcik | .................. | G01T 1/2019 |
| 11,246,554 B2* | 2/2022 | Wang | ..................... | A61B 6/544 |
| 11,262,461 B2* | 3/2022 | Ushikura | .................. | G01T 1/20 |
| 11,417,440 B2* | 8/2022 | Nakatsugawa | .......... | G21K 4/00 |
| 11,609,347 B2* | 3/2023 | Iwakiri | ................. | G01T 1/2018 |
| 11,612,366 B2* | 3/2023 | Ushikura | ................ | G01T 1/244 378/62 |
| 11,624,844 B2* | 4/2023 | Ushikura | ............ | G01T 1/20189 250/366 |
| 11,786,194 B2* | 10/2023 | Okada | .................... | G01T 1/2018 250/366 |
| 11,852,756 B2* | 12/2023 | Bogumil | ................. | G01T 1/169 |
| 11,988,786 B2* | 5/2024 | Bogumil | ................. | G01T 1/244 |
| 2010/0072379 A1 | 3/2010 | Nishino et al. | | |
| 2012/0153176 A1 | 6/2012 | Tsukerman | | |
| 2013/0334427 A1 | 12/2013 | Kaneko et al. | | |
| 2015/0001407 A1 | 1/2015 | Schellenberg et al. | | |

FOREIGN PATENT DOCUMENTS

| | | |
|---|---|---|
| JP | 2012173128 A | 9/2012 |
| JP | 2014048058 A | 3/2014 |
| JP | 2015523548 A | 8/2015 |
| KR | 20020081074 A | 10/2002 |
| KR | 101420250 B1 | 7/2014 |
| KR | 20150018339 A | 2/2015 |
| KR | 20150136429 A | 12/2015 |
| KR | 20160083608 A | 7/2016 |
| KR | 101735479 B1 | 5/2017 |
| KR | 101749713 B1 | 7/2017 |
| KR | 101785459 B1 | 11/2017 |
| KR | 20180042572 A | 4/2018 |
| KR | 102016780 B1 | 8/2019 |
| KR | 102051957 B1 | 12/2019 |
| KR | 20200001884 A | 1/2020 |
| KR | 102208080 B1 | 1/2021 |
| KR | 102373241 B1 | 3/2022 |
| WO | 2021006304 A1 | 1/2021 |

* cited by examiner (a)

(b)

(a)

(b)

(a)

(b)

RADIATION INSPECTION APPARATUS INCLUDING A RADIATION DETECTOR COMPRISING A RADIATION DETECTING PANEL, A BENDTNG SUPPORT UNIT, AND A BENDING ADJUSTMENT UNIT

TECHNICAL FIELD

The present disclosure relates to a radiation detector and a radiation inspection apparatus including same and, more specifically, to the radiation detector including a bendable radiation detecting panel and the radiation inspection apparatus including same.

BACKGROUND ART

Non-destructive inspection refers to measurement technology used as a means of quality control and quality assurance of materials, equipment, and structures. Through this, it is possible to examine the surface of a subject, the presence or absence of internal defects and the state therein, or the characteristics and internal structure of the subject, while not damaging, separating, or destroying the subject but maintaining the original shape thereof.

In other words, the non-destructive inspection is a special method using physical phenomena such as ultrasonic waves, radiation, and eddy currents, which refers to any inspection that finds out the presence and absence of defects, states or characteristics, internal structure, etc., while not destroying, separating, or damaging subjects such as materials or products.

The main purpose of non-destructive inspection is to improve reliability, and furthermore, the non-destructive inspection makes it possible to reduce the defect rate during a manufacturing stage, thereby reducing manufacturing costs and improving manufacturing technology.

There are various types of non-destructive inspection, but radiographic testing (RT) is mainly used.

The main applications, in which the radiographic testing (RT) is used, include electrical electronics, metals, aerospace, industrial equipment, security, etc. This testing is also used in a quality control process of printed circuit board manufacturing, electrical and electronic inspection of solder joints, copper wires, bonding pads, etc., and metal inspection such as cracks, porosity, and foreign material inclusions in materials.

In addition, the radiographic testing is also used to detect damage to internal structures of aircraft, and turbine blade bodies, composite materials, and the like are mainly subjected to this testing. In addition, this testing is widely used in pipe welding line inspection of nuclear power and general power generation facilities, and is performed using a crawler that transports a radiation source along the inner surface of a pipe so as to image the welding state.

In particular, the pipe welding line inspection, among radiation non-destructive inspection, is an inspection to check for defects (e.g., pores, slag mixing, cracks, poor fusion, incomplete penetration, root concavities, undercuts, etc.).

According to the related art, a method is widely used, in which radiation is made to pass through a subject, images are formed on a radiation detecting panel (e.g., a film or glass type TFT), and defects inside the subject are checked. Here, when the subject is irradiated with the radiation, a difference in the amount of transmitted radiation occurs due to a density difference according to the shape and thickness of the subject. Accordingly, the degree of light sensitivity of a radiation detecting panel (sensor panel) becomes different. A difference in concentration is generated according to the degree of light sensitivity of the radiation detecting panel, and thus, a specific image (or difference in contrast for each part) of the subject is obtained. Accordingly, since the contrast of a defective portion is shown darker than that of a normal portion during image evaluation, the location and size of the defect can be confirmed.

As the pipe welding line inspection, AR (film) or CR (computed radiography) inspection has been used. In the case of AR or CR imaging, a separate developer and other accessories are required for development after an evaluation image is acquired. Therefore, additional imaging can be made only when a process of reading and erasing an image plate (IP) is performed after one time imaging of the subject, and thus, there are limitations in cost, time, work inefficiency, etc. In addition, in the case of AR or CR imaging, an image can be acquired by deforming an image plate or a flexible film according to the shape of a cylindrical subject such as a pipe. However, since image correction is impossible due to the inherent traces of an IP cassette and the thickness of the subject, an operator (or user) cannot easily detect the defect of interest. In addition, in the case of CR-type radiation detection, the radiation energy emitted to the subject is stored in the IP cassette, and development can be made through a separate reader between image confirmations. Accordingly, a separate developer has to be provided, and the image acquisition time is delayed, and thus, the efficiency is deteriorated.

In order to solve the above limitations, a digital radiography (DR) inspection technique using a flat panel detector has been recently introduced. However, in the case of the digital imaging method according to the related art, improved results can be obtained in terms of cost and work efficiency. However, in terms of materials and structures of the radiation detecting panel (glass) and components such as mechanisms and hardware, regions except for the region in contact with the radiation detecting panel do not exhibit flexibility, and thus, distorted images are acquired when images of a subject having a curvature are captured. Therefore, normal image evaluation of the distorted portions becomes difficult, and images have to be captured several times for accurate image evaluation.

(Patent Document 1) Korean Patent Publication No. 10-2002-0081074

DISCLOSURE OF THE INVENTIVE CONCEPT

Technical Problem

The present inventive concept provides a radiation detector capable of maintaining a bending state of a radiation detecting panel and a radiation inspection apparatus including same.

Technical Solution

A radiation detector according to an embodiment of the present inventive concept includes: a radiation detecting panel which is flexible, extending in a first direction, and detecting radiation incident to a first face; and a bending support unit which is plate-shaped, provided on a second face of the radiation detecting panel opposite to the first face to support the radiation detecting panel, and having a flexibility, wherein the flexibility of the bending support unit is less than a flexibility of the radiation detecting panel.

The radiation detector may further include a bending adjustment unit which is connected to the bending support unit and adjusts bending of the radiation detecting panel with respect to a bending axis parallel to a second direction crossing the first direction.

The radiation detector may further include a plurality of folding plates provided on the second face of the radiation detecting panel, extending in the second direction and arranged in the first direction.

The radiation detector may further include a body unit to which at least a portion of the plurality of folding plates are fixed, wherein the radiation detecting panel is bent with respect to the body unit.

The body unit may include an electronic component box in which an electronic circuit for driving the radiation detecting panel is mounted.

The bending adjustment unit may include: a first connection portion, one side of which is connected to one side of the bending support unit; and a second connection portion, the other side of which is connected to the other side of the bending support unit.

The bending adjustment unit may further include first and second hinges which are spaced apart from each other, and to which the other side of the first connection portion and the one side of the second connection portion are respectively connected, wherein the first connection portion rotates about the first hinge as a rotation axis, and the second connection portion rotates about the second hinge as a rotation axis.

Each of the first hinge and the second hinge may have a hinge disc.

The other side of the first connection portion and the one side of the second connection portion may be movable to adjust a distance between each other.

The bending adjustment unit may further include: a first latch provided on the other side of the first connection portion; a second latch provided on the one side of the second connection portion; and a plurality of latch grooves arranged in the movement directions of the other side of the first connection portion and the one side of the second connection portion.

The bending adjustment unit may further include a latch driver that adjusts locking and releasing of the first latch and the second latch.

The latch driver may include: a connection member connected to the first latch and the second latch, respectively; and an elastic member configured to provide elastic force to the connection member.

The bending adjustment unit may further include: a first moving gear connected to the other side of the first connection portion; a second moving gear connected to the one side of the second connection portion; and a driving gear configured to engage respectively with the first moving gear and the second moving gear to move the first moving gear and the second moving gear.

The radiation detector may further include a housing which accommodates the radiation detecting panel and has a radiation-transmissive region on a face facing the radiation detecting panel.

The radiation-transmissive region of the housing may include a curved surface, and the radiation detecting panel may be bent along the radiation-transmissive region of the curved surface and fixed to the housing.

The housing may include an electronic component box in which an electronic circuit for driving the radiation detecting panel is mounted, on one side in the first direction.

A radiation inspection apparatus according to another embodiment of the present inventive concept includes: a radiation generating unit configured to irradiate a subject with radiation; and the radiation detector according to an embodiment of the present inventive concept, which detects the radiation that passes through the subject.

The subject may be disposed between the radiation generating unit and the radiation detector, and the bending adjustment unit may be configured to adjust bending of the radiation detecting panel according to the curvature of a surface of the subject that faces the radiation detecting panel.

Advantageous Effects

In the radiation detector according to an embodiment of the present inventive concept, the bending support unit having less flexibility than the flexible radiation detecting panel may support the radiation detecting panel, guide the bending of the radiation detecting panel, and help the radiation detecting panel to maintain a bent state. Also, the bending of the radiation detecting panel may be adjusted by using the bending adjustment unit connected to the bending support unit, the radiation detecting panel may be bent to form a certain curved surface, and the curved state may be maintained at a certain angle. Therefore, it is possible to rapidly acquire radiographic images of various subjects having various curvatures. Accordingly, an image without distortion may be acquired in real time for the subject having any curvature, and the examination and diagnosis may be directly read on site using the acquired image having excellent quality. That is, during the non-destructive inspection for cracks that may occur in various types of structures or foreign substances that may be included in streamlined food such as cans, an image having superior quality may be obtained by utilizing the bendable characteristics of the radiation detecting panel, compared to an image from a flat panel-type radiation detector according to the related art.

In addition, the radiation detecting panel is formed based on a flexible organic semiconductor and easily enlarged, and thus may simultaneously solve the limitations of high price and low yield due to a complicated process, which are chronic limitations of a flat panel-type radiation detector according to the related art. This makes it possible to commercialize a high-performance, large-scale digital radiography detector. In addition, the radiation (e.g., X-rays) is converted into electrical signals in the radiation detecting panel by using organic material technology. Accordingly, as the radiation detecting panel having a low driving voltage is developed, the production cost is reduced, and the thin and lightweight radiation detector may be manufactured through a low voltage circuit design.

Moreover, the plurality of folding plates may prevent the radiation detecting panel from being sharply bent and damaged, and each pixel(s) in the radiation detecting panel may be allowed to remain flat without being bent as much as possible.

Accordingly, the bending support unit having elasticity is bent by the first connection portion and the second connection portion respectively connected to both sides of the bending support unit, and thus, the radiation detecting panel may be easily bent. In addition, the bending support unit and the radiation detecting panel may be maintained at a certain angle in a bent state.

Furthermore, the bending of the radiation detecting panel may be fixed by using the housing formed in a curved surface. Also, various housings having curved surfaces determined according to various subjects may be provided, and these housings may be replaced with housings having appropriate curved surfaces according to the subjects.

MODE FOR CARRYING OUT THE INVENTIVE CONCEPT

Figure 1:
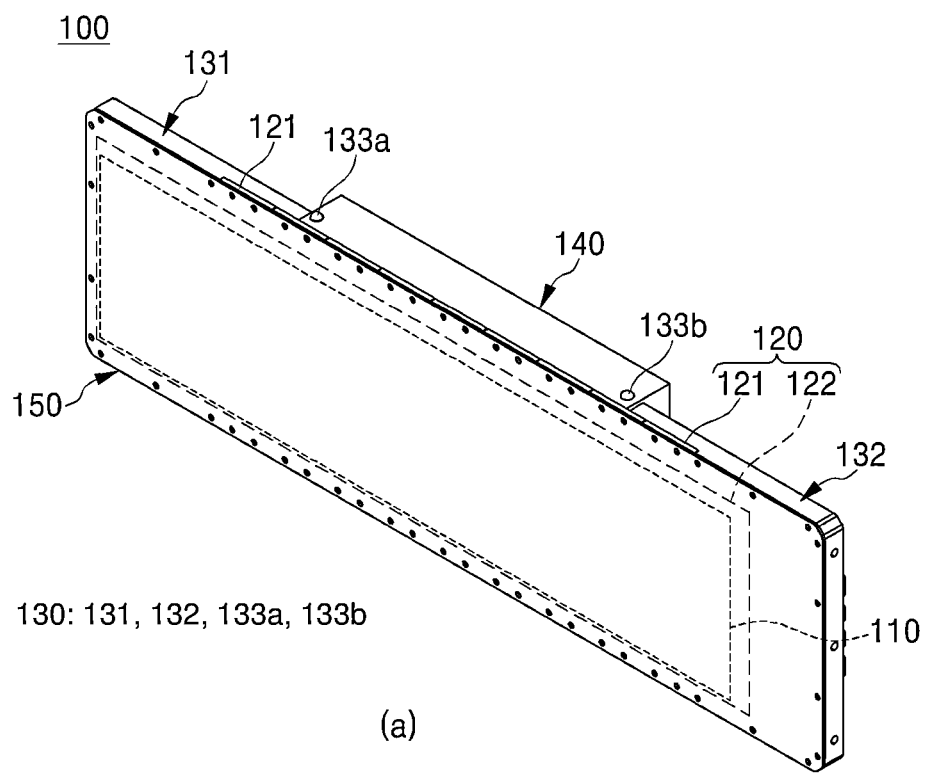
FIG. 1 is a view showing a radiation detector according to an embodiment of the present inventive concept.
Figure 1:
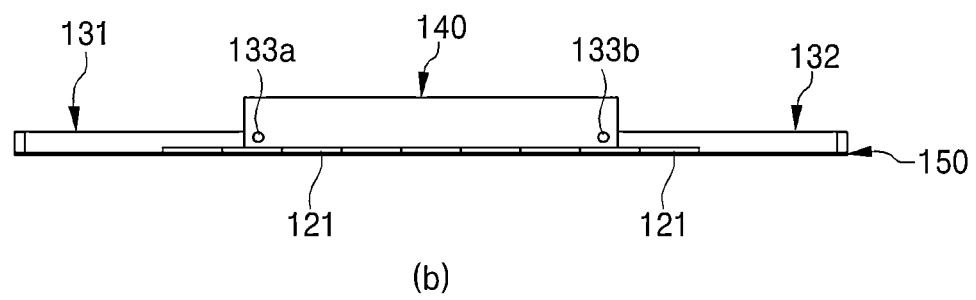

Hereinafter, embodiments of the present inventive concept will be described in more detail with reference to the accompanying drawings. The present inventive concept may, however, be embodied in different forms and should not be construed as limited to the embodiments set forth herein. Rather, these embodiments are provided so that this disclosure will be thorough and complete, and will fully convey the scope of the present inventive concept to those skilled in the art. In the descriptions, the same elements are denoted by the same reference numerals. In the figures, the dimensions are partially exaggerated in order to accurately describe an embodiment of the present inventive concept. Like reference numerals refer to like elements throughout.

FIG. 1 is a view showing a radiation detector according to an embodiment of the present inventive concept. (a) of FIG. 1 is a perspective view of the radiation detector, and (b) of FIG. 1 is a plan view of the radiation detector.

Referring to FIG. 1, a radiation detector 100 according to an embodiment of the present inventive concept may include: a radiation detecting panel 110 which is flexible, extending in a first direction, and detecting radiation incident to a first face; and a bending support unit 120 which is plate-shaped, provided on a second face of the radiation detecting panel 110 opposite side to the first face to support the radiation detecting panel 110, and having a flexibility.

The radiation detecting panel 110 may have flexibility, extend in the first direction, and detect the radiation (e.g., X-rays) incident onto the first face. For example, the radiation detecting panel 110 may be formed based on an organic semiconductor such as flexible polyimide (PI). Since hard and brittle glass is not included therein, the thickness may be reduced, and flexibility may be provided to enable bending. In this case, the radiation detecting panel 110 may include a thin film transistor (TFT).

Here, the radiation detecting panel 110 may have the first face and the second face that face each other, the radiation incident onto the first face may be converted into an electrical signal that enables image signal processing, and a plurality of pixels (not shown) may be arranged thereon in the form of matrix. Here, the radiation may include an X-ray, an a-ray, a y-ray, an electron ray, a UV-ray, or the like, and the plurality of pixels (not shown) may be made of a plurality of switching cell(s) and photoelectric transformation element(s).

In this case, the radiation detecting panel 110 may have a thickness of 1.25 mm or less. When the thickness of the radiation detecting panel 110 exceeds 1.25 mm, the flexibility of the radiation detecting panel 110 may be deteriorated, and breakage may easily occur therein during bending. Generally, the radiation detecting panel 110 based on an organic semiconductor may have a thickness of 0.5 to 0.6 mm, and may have a smaller thickness when having sufficient performance.

The radiation detecting panel 110 having the flexibility may be easily enlarged, and simultaneously solve the limitations of high price and low yield due to a complicated process, which are chronic limitations of a flat panel-type radiation detector according to the related art. This makes it possible to commercialize a high-performance, large-scale digital radiography detector. In addition, the radiation detecting panel 110 may have a low driving voltage by converting the radiation (e.g., X-rays) into electrical signals using organic material technology. Accordingly, the production cost is reduced, and the thin and lightweight radiation detector 100 may be manufactured through a low voltage circuit design.

The bending support unit 120 may be provided on the second face of the radiation detecting panel 110 on the opposite side from the first face and support the radiation detecting panel 110, and may be flexible and have a plate (laminar) shape such as a sheet or a layer. Herein, the bending support unit 120 may extend in the first direction along the radiation detecting panel 110, and may have elasticity or rigidity greater than that of the radiation detecting panel 110. In this case, the bending support unit 120 may be attached to and support the radiation detecting panel 110, or may be bonded to and support the radiation detecting panel 110. Consequently, bending of the radiation detecting panel 110 may be guided so that the radiation detecting panel 110 can be stably bent while excessive force is not applied thereto. In addition, it is possible to prevent damage to the radiation detecting panel 110 during the bending. For example, the bending support unit 120 has the elasticity and may be bent gradually rather than drastically by a bending force, and the radiation detecting panel 110 may also be curled and bent along the bending support unit 120 that is bending. When the bending force is removed, the bending support unit 120 is unfolded again, and the radiation detecting panel 110 may be unfolded and restored to an original state (e.g., flat state).

Here, the flexibility of the bending support unit 120 may be less than the flexibility of the radiation detecting panel 110. That is, the bending support unit 120 has the flexibility, but has less flexibility than the radiation detecting panel 110 and thus may be bent while forming continuous curvature (e.g., the entirety of the bending support unit forms curvature) without fluttering. Consequently, the entirety of the radiation detecting panel 110 may maintain a bending state having certain curvature.

For example, the bending support unit 120 may maintain bending of the radiation detecting panel 110 at certain curvature by using the flexibility less than the flexibility of the radiation detecting panel 110, and thus, the bending of the radiation detecting panel 110 may be guided and maintained. The bending support unit 120 is bent by a bending adjustment unit 130 and may maintain the bending state of the radiation detecting panel 110 at certain curvature, and may make the radiation detecting panel 110 maintained at certain curvature and fixed to a housing 150.

The radiation detector 100 according to the present invention may further include a bending adjustment unit 130 which is connected to the bending support unit 120 and adjusts bending of the radiation detecting panel 110 with respect to a bending axis parallel to a second direction crossing the first direction.

The bending adjustment unit 130 may be connected directly or indirectly to the bending support unit 120, adjust the bending of the radiation detecting panel 110 with respect to the bending axis parallel to the second direction crossing the first direction, and make the radiation detecting panel 110 bent and unfolded. When the bending force is applied to the radiation detecting panel 110 in a state where the bending adjustment unit 130 is connected directly to the radiation detecting panel 110, the radiation detecting panel 110 may be sharply folded. Also, a force for bending the bending support unit 120 having higher rigidity may be transmitted, and thus, an excessive force may be applied to the radiation detecting panel 110. Accordingly, the radiation detecting panel 110 may be damaged. Therefore, the bending adjustment unit 130 is connected to the bending support unit 120, and the bending support unit 120 is bent. As the bending support unit 120 is bent, the radiation detecting panel 110 may be bent stably.

Here, the bending adjustment unit 130 may adjust the distance between both sides of the bending support unit 120 in the first direction, thereby bending the radiation detecting panel 110. When both sides of the bending support unit 120 in the first direction are brought closer to each other, a curved surface (or curvature) may be formed between both sides of the radiation detecting panel 110 in the first direction.

Therefore, the radiation detector 100 according to the present inventive concept may adjust the bending of the radiation detecting panel 110 by using the bending adjustment unit 130, and may bend the radiation detecting panel 110 to form a certain curved surface and may maintain the curved state at a certain angle. Therefore, it is possible to rapidly acquire radiographic images of various subjects 10 having various curvatures. Accordingly, an image without distortion may be acquired in real time for the subject 10 having any curvature, and the examination and diagnosis may be directly read on site using the acquired image having excellent quality.

Also, the radiation detector 100 according to the present inventive concept may further include a plurality of folding plates 121 provided on the second face of the radiation detecting panel 110, extending in the second direction and arranged in the first direction. The plurality of folding plates 121 may be extended in the second direction, and provided on the second face of the radiation detecting panel 110 and arranged in the first direction, and may be directly or indirectly connected to each other. Here, the plurality of folding plates 121 may be separate components, or may be configured to be included in the bending support unit 120. In this case, the plurality of folding plates 121 may be provided on a second face of the bending support unit 120 on the opposite side from a first face of the bending support unit 120 that faces the radiation detecting panel 110. The radiation detecting panel 110 may be supported by the first face of the bending support unit 120, and the plurality of folding plates 121 may be supported by the second face of the bending support unit 120. Also, when the plurality of folding plates 121 are configured to be included in the bending support unit 120, the plurality of folding plates 121 may be supported by a reinforcing plate 122. For example, the plurality of folding plates 121 may be made of plastic-based resin or aluminum materials, and may be individually connected (or attached) to the reinforcing plate 122 provided between the radiation detecting panel 110 and the folding plates and indirectly connected to each other by the reinforcing plate 122, or may be directly connected to each other in the form of a chain by a separate connecting means. The plurality of folding plates 121 may prevent the radiation detecting panel 110 from being sharply bent and damaged, and may allow each pixel(s) in the radiation detecting panel 110 to remain flat without being bent as much as possible. Here, the plurality of folding plates 121 may be subsidiary materials for fixing a radiation transmitting plate and/or the reinforcing plate 122, serve to form a perfect circular arc shape when the curvature is formed, and also serve as a stopper for preventing bending over a certain curvature.

When the radiation detecting panel 110 is bent and each pixel(s) is also bent together, the planar area (or horizontal cross-sectional area) of each pixel(s) may vary, and there may be a difference in planar areas between each pixel(s). Therefore, distortion of the radiographic image may occur due to the difference in planar areas. Accordingly, each of the plurality of folding plates 121 maintains a plane in each section of the radiation detecting panel 110 in the first direction, thus making it possible to maximally suppress or prevent bending of each pixel(s). For example, each pixel(s) may not be formed over two or more folding plates 121, or only a portion (e.g., half) thereof may not be formed over one folding plate 121. That is, the entire pixel may be positioned on any one of the folding plates 121. That is, one entire pixel of the plurality of pixels may be positioned on any one of the folding plates 121. In this manner, all the pixels may be respectively positioned on the corresponding folding plates 121, completely rather than partially. In this case, one or more pixels may be positioned on each folding plate 121, and the number of pixels positioned on each folding plate 121 may be a natural number. When spaced apart from each other, the plurality of folding plates 121 may be spaced apart according to intervals of the plurality of pixels and may be spaced apart at the intervals of the plurality of pixels.

Here, the plurality of folding plates 121 may be configured to be folded by being spaced apart from each other at a predetermined interval (or certain interval). When the bending support unit 120 is bent in a curved shape, both edges (or both sides) of each of the folding plates 121 in the first direction come into contact with each other to form a curved shape, and the radiation detecting panel 110 may be bent according to the curved shape.

In addition, the bending support unit 120 may include a reinforcing plate 122 provided between the plurality of folding plates 121 and the radiation detecting panel 110. The reinforcing plate 122 may have a first face and a second face that face each other and is provided between the plurality of folding plates 121 and the radiation detecting panel 110. The radiation detecting panel 110 may be supported by the first face, and the plurality of folding plates 121 may be supported by (or attached to) the second face. Here, the reinforcing plate 122 may be configured to be included in the bending support unit 120, or a separate component. In this case, the reinforcing plate 122 may support and protect the radiation detecting panel 110, and has greater rigidity than the radiation detecting panel 110, and thus, may suppress or prevent the radiation detecting panel 110 from being suddenly bent or shaken by wind, vibration, etc., and may be bent by a bending force due to elasticity thereof. For example, the reinforcing plate 122 may be made of stainless steel, may be bent to form a curved surface when receiving a force from both sides in the first direction, and may be unfolded and returned to its original state by restoring force (or elasticity) when the force is removed. In this case, in order to maintain the bending of the radiation detecting panel 110, the bending adjustment unit 130 may support both sides in the first direction so that the reinforcing plate 122 is not unfolded again in a state in which the reinforcing plate is bent to form the curved surface. Here, the reinforcing plate 122 may be a flat plate having the front/rear sides to which the radiation detecting panel 110 and the plurality of folding plates 121 are attached and/or assembled. This reinforcing plate may be freely deformed during bending, and may be made of a material having elasticity to return to an original flat shape without maintaining the corresponding shape during deformation.

Meanwhile, the reinforcing plate 122 may have a material, thickness, or the like that allows the reinforcing plate to be folded together with the radiation detecting panel 110 when the reinforcing plate is bent so as to bend the radiation detecting panel 110. Also, the reinforcing plate 122 may serve to protect the plurality of folding plates 121 that support or prop up the radiation detecting panel 110, and may allow the radiation detecting panel 110 to maintain a curved state or an original flat state. For example, the reinforcing plate 122 may be bent to form a curved surface when receiving forces from both sides in the first direction, and is plastically deformed and may continuously maintain the formed curved surface. Then, the reinforcing plate may return to its original flat state and maintain the state when receiving the force in the opposite direction. Therefore, the reinforcing plate 122 may have a material, shape, thickness, and the like for achieving the above. That is, the radiation detecting panel 110 may maintain a bent state by the reinforcing plate 122, and this bending state may be maintained depending on the material, physical properties, thickness, and the like of the reinforcing plate 122. When pressure is applied in the opposite direction, the radiation detecting panel returns to its original state and maintains its original state in the returned state by the reinforcing plate 122.

In addition, the bending support unit 120 may be a bonding layer or adhesive layer for attaching the radiation detecting panel 110 to the plurality of folding plates 121, and may provide grounding to the radiation detecting panel 110. Also, the bending support unit 120 may be formed by laminating two or more layers (or components) selected from among a metal layer for providing ground to the radiation detecting panel 110, the reinforcing plate 122, and the adhesive layer, but is not limited thereto. Any component may be used as the bending support unit as long as it is disposed between the plurality of folding plates 121 and the radiation detecting panel 110 to buffer the force, which is applied to the radiation detecting panel 110 to bend the radiation detecting panel 110, thereby stabling guiding the bending of the radiation detecting panel 110.

The radiation detector 100 according to the present inventive concept may further include a body unit 140 to which at least a portion of the plurality of folding plates 121 are fixed.

At least a portion of the plurality of folding plates 121 may be fixed to the body unit 140, and the radiation detecting panel 110 connected to the plurality of folding plates 121 may be stably supported.

In this case, the radiation detecting panel 110 may be bent with respect to the body unit 140. For example, a central portion of the radiation detecting panel 110 is fixed to the body unit 140, and a force is applied to both sides thereof in the first direction to decrease the distance between both sides in the first direction. Through only this process, the radiation detecting panel 110 may be bent. In addition, a curvature (or curved surface) may be stably formed on the radiation detecting panel 110 while unfolding from the central portion of the radiation detecting panel 110 toward both sides in the first direction.

Here, the body unit 140 may include an electronic component box in which an electronic circuit for driving the radiation detecting panel 110 is mounted. That is, the body unit 140 may include the electronic component box in which the electronic circuit for driving the radiation detecting panel 110 is mounted, and a radiation detecting system may be provided therein. For example, a power system (e.g., a battery, etc.) for supplying power to the radiation detecting panel 110 may be mounted to the body unit 140, and this power system supplies the power to the radiation detecting panel 110 to drive the radiation detecting panel 110. In addition, components (e.g., electronic components, etc.) for driving the radiation detecting panel 110 and/or bending the radiation detecting panel 110 may be mounted to the body unit 140. Here, the body unit 140 may include a main circuit part, and may be provided in the form of an aluminum case.

Also, the body unit 140 may be located not only at the center (portion) on the second face of the bending support unit 120 (or the second face of the plurality of folding plates), but, if necessary, at an edge (portion) on at least one of both sides of the bending support unit 120 in the first direction. However, the body unit is not limited thereto, and may be disposed in all other regions except for the same region as the radiation detecting panel 110.

Also, the bending adjustment unit 130 may include: a first connection portion 131, one side of which is connected to one side of the bending support unit 120; and a second connection portion 132, the other side of which is connected to the other side of the bending support unit 120. One side of the first connection portion 131 may be directly or indirectly connected to one side of the bending support unit 120 in the first direction, and the other side thereof may axially rotate about a fixed rotation axis or move in a horizontal direction, thereby providing a bending force to one side of the bending support unit 120 in the first direction.

The other side of the second connection portion 132 may be directly or indirectly connected to the other side of the bending support unit 120 in the first direction, and one side thereof may axially rotate about a fixed rotation axis or move in a horizontal direction, thereby providing a bending force to the other side of the bending support unit 120 in the first direction.

For example, the first connection portion 131 and the second connection portion 132 may include connection plates, and may be provided symmetrically to each other. In addition, the first connection portion 131 and the second connection portion 132 may include bending arms, and may have structures which are directly or indirectly connected to the body unit 140 and/or the bending support unit 120. Accordingly, both sides of the bending support unit 120 in the first direction are pushed up, respectively. In this case, the first connection portion 131 and the second connection portion 132 may be made of plastic resin or aluminum materials.

The one side of the bending support unit 120 in the first direction may be bent by axially rotating the first connection portion 131 about the other side of the first connection portion 131 or by horizontally moving the other side of the first connection portion 131. The other side of the bending support unit 120 in the first direction may be bent by axially rotating the second connection portion 132 about the one side of the second connection portion 132 or by horizontally moving the one side of the second connection portion 132. Accordingly, the radiation detecting panel 110 may be easily bent. In this case, the first connection portion 131 and/or the second connection portion 132 may be axially rotated or moved gradually, and thus, the radiation detecting panel 110 may be bent stably rather than drastically.

Here, the one side of the first connection portion 131 may be axially rotated about the other side thereof, and the other side of the second connection portion 132 may be axially rotated about the one side thereof. That is, the first connection portion 131 may be axially rotated about the other side of the first connection portion 131 as a rotation axis, and the second connection portion 132 may be axially rotated about the one side of the second connection portion 132 as a rotation axis. Here, the rotation axis may be a fixed rotation axis. In this case, the one side of the first connection portion 131 is connected to the one side of the bending support unit 120 in the first direction, and the one side of the bending support unit 120 in the first direction may be bent by the rotation of the one side of the first connection portion 131, and the other side of the second connection portion 132 is connected to the other side of the bending support unit 120 in the first direction, and the other side of the bending support unit 120 in the first direction may be bent by the rotation of the other side of the second connection portion 132. Accordingly, the radiation detecting panel 110 may be easily bent.

Also, the bending adjustment unit 130 may further include first and second hinges 133a and 133b which are spaced apart from each other and connected to the other side of the first connection portion 131 and the one side of the second connection portion 132, respectively. The first hinge 133a may be connected to the other side of the first connection portion 131 and fixed to the body unit 140, and thus, a fixed rotation axis may be provided on the other side of the first connection portion 131.

The second hinge 133b may be connected to the one side of the second connection portion 132 and fixed to the body unit 140, and thus, a fixed rotation axis may be provided on the one side of the second connection portion 132.

Here, the first hinge 133a and the second hinge 133b may be spaced apart from each other on the body unit 140, and may be spaced part from each other in a direction parallel to a direction of both sides of the bending support unit 120 when the bending support unit 120 is unfolded. Here, both sides of the bending support unit 120 may represent both sides in the first direction. For example, the one side of the first connection portion 131 and the other side of the second connection portion 132 may be fixed to the folding plates 121 on both ends (or both sides) in the first direction, respectively, and the other side of the first connection portion 131 and the one side of the second connection portion 132 may be fixed to the body unit 140 through the first hinge 133a and the second hinge 133b. During the bending, the folding plates 121 on both ends in the first direction may be pushed up by the first connection portion 131 and the second connection portion 132, respectively, with respect to the first hinge 133a and the second hinge 133b and/or the connection portion of the body unit 140.

That is, the first connection portion 131 may rotate about the first hinge 133a as a rotation axis, and the second connection portion 132 may rotate about the second hinge 133b as a rotation axis. The fixed rotation axises may be provided on the other side of the first connection portion 131 and the one side of the second connection portion 132 by the first hinge 133a and the second hinge 133b, respectively. Consequently, the one side of the bending support unit 120 in the first direction may be bent by the axial rotation of the one side of the first connection portion 131 using the first hinge 133a as a rotation axis, and the other side of the bending support unit 120 in the first direction may be bent by the axial rotation of the other side of the second connection portion 132 using the second hinge 133b as a rotation axis. Accordingly, the radiation detecting panel 110 may be easily bent.

Also, each of the first hinge 133a and the second hinge 133b may have a hinge disc (not shown), and the first connection portion 131 and the second connection portion 132 may maintain an (axial) rotation angle in a bent state when the bending forces on both sides of the bending support unit 120 in the first direction are removed by the hinge disc (not shown). For example, the first hinge 133a and the second hinge 133b may be torque hinges. As the plurality of torque hinges are utilized, a certain curvature may be maintained by a friction force between a hinge shaft and the hinge disc.

Figure 2:
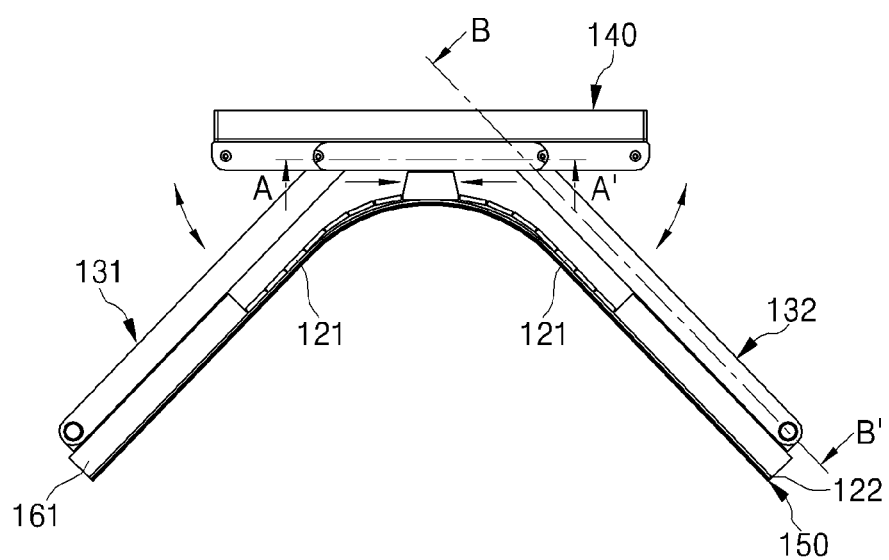
FIG. 2 is a view showing a first modified example of a radiation detector according to an embodiment of the present inventive concept.

FIG. 2 is a view showing a first modified example of a radiation detector according to an embodiment of the present inventive concept.

Referring to FIG. 2, the other side of a first connection portion 131 and one side of a second connection portion 132 may be movable to adjust a distance between each other. In addition to the method using the hinge as shown in FIG. 1, both sides of the bending support unit 120 in the first direction may be bent by adjusting the distance between the other side of the first connection portion 131 and one side of the second connection portion 132. Accordingly, the radiation detecting panel 110 may be bent.

For example, the other side of the first connection portion 131 and the one side of the second connection portion 132 may move in a direction parallel to the direction of both sides of the bending support unit 120 when the bending support unit 120 is unfolded. The one side of the first connection portion 131 is connected to the one side of the bending support unit 120. Therefore, when the other side of the first connection portion 131 moves in a direction closer to the one side of the bending support unit 120, the one side of the first connection portion 131 does not move in a direction parallel to the movement direction of the other side of the first connection portion 131, but pushes up the one side of the bending support unit 120. Accordingly, the one side of the bending support unit 120 may be bent. Also, the other side of the second connection portion 132 is connected to the other side of the bending support unit 120. Therefore, when the one side of the second connection portion 132 moves in a direction closer to the other side of the bending support unit 120, the other side of the second connection portion 132 does not move in a direction parallel to the movement direction of the one side of the second connection portion 132, but pushes up the other side of the bending support unit 120. Accordingly, the other side of the bending support unit 120 may be bent. Consequently, both sides of the bending support unit 120 in the first direction may be bent, and the radiation detecting panel 110 may be easily bent. A degree (e.g., curvature) of bending of the radiation detecting panel 110 may be adjusted depending on the distance between the other side of the first connection portion 131 and the one side of the second connection portion 132.

Figure 3:
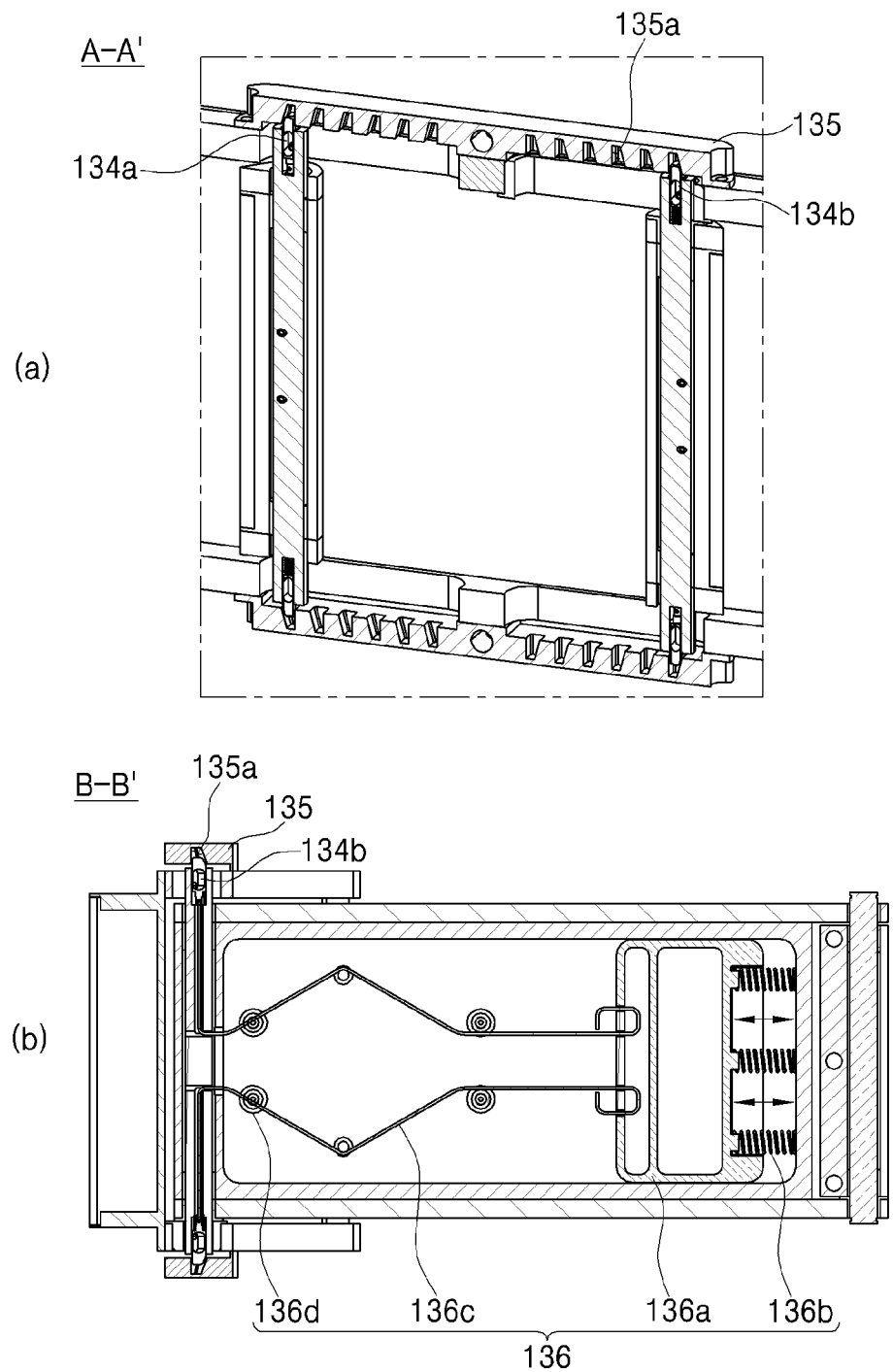
FIG. 3 is a partial cross-sectional view of the first modified example of the radiation detector according to an embodiment of the present inventive concept.

FIG. 3 is a partial cross-sectional view of the first modified example of the radiation detector according to an embodiment of the present inventive concept. (a) of FIG. 3 is a cross-sectional view taken along line A-A' of FIG. 2, and (b) of FIG. 3 is a cross-sectional view taken along line B-B' of FIG. 2.

Referring to FIG. 3, the bending adjustment unit 130 may further include: a first latch 134a provided on the other side of the first connection portion 131; a second latch 134b provided on the one side of the second connection portion 132; and a plurality of latch grooves 135a arranged in the movement directions of the other side of the first connection portion 131 and the one side of the second connection portion 132. The first latch 134a may be provided on the other side of the first connection portion 131, and inserted into or removed from a latch groove 135a. When the first latch is inserted into the latch groove 135a, the position of the other side of the first connection portion 131 may be fixed.

The second latch 134b may be provided on the one side of the second connection portion 132, and inserted into or removed from a latch groove 135a. When the second latch is inserted into the latch groove 135a, the position of the one side of the second connection portion 132 may be fixed.

The plurality of latch grooves 135a may be arranged in the movement directions of the other side of the first connection portion 131 and the one side of the second connection portion 132, and the first latch 134a and/or the second latch 134b may be inserted into and locked to the latch grooves. Also, the positions of the other side of the first connection portion 131 and/or the one side of the second connection portion 132 may be fixed by the latch grooves. For example, the plurality of latch grooves 135a may be arranged in a direction parallel to the direction of both sides of the bending support unit 120 when the bending support unit 120 is unfolded, and may be formed on a locking body 135 and spaced apart from each other in the extension direction of the locking body 135 that extends in a direction parallel to the direction of both sides of the bending support unit 120 when the bending support unit 120 is unfolded.

Since the bending support unit 120 has elasticity, a restoring force may act thereon when the bending force is removed from both sides of the bending support unit 120 in the first direction. Accordingly, the radiation detecting panel 110 may be unfolded without maintaining the bent state. Accordingly, it is required to bend the radiation detecting panel 110 to a desired curvature (or a predetermined curvature) and maintain the bending state of the radiation detecting panel 110. The first latch 134a and the second latch 134b are inserted into and locked to respective ones of the plurality of latch grooves 135a, and thus, the positions of the other side of the first connection portion 131 and the one side of the second connection portions 132 may be fixed. Consequently, in the bending state of the radiation detecting panel 110, the bending state of the radiation detecting panel 110 may be maintained, even when the bending forces on both sides of the bending support unit 120 in the first direction are removed.

Here, the bending adjustment unit 130 may further include a latch driver 136 that adjusts locking and releasing of the first latch 134a and the second latch 134b. The latch driver 136 may adjust the locking and releasing of the first latch 134a and the second latch 134b. The latch driver may cause the first latch 134a and/or the second latch 134b to be inserted into and locked to the latch groove 135a, thereby fixing the position of the other side of the first connection portion 131 and the one side of the second connection portion 132. Also, the latch driver may release locking of the first latch 134a and/or the second latch 134b, thereby allowing the other side of the first connection portion 131 and/or the one side of the second connection portion 132 to move. Consequently, during the releasing of the first latch 134a and the second latch 134b, the bending of the radiation detecting panel 110 may be adjusted by moving the other side of the first connection portion 131 and/or the one side of the second connection portion 132. Also, during the locking of the first latch 134a and the second latch 134b, the bending state of the radiation detecting panel 110 may be maintained.

For example, the latch driver 136 may include: a connection member 136c connected to the first latch 134a and the second latch 134b, respectively; and an elastic member 136b for providing elastic force to the connection member 136c. The connection member 136c may include a plurality of wires, and one end thereof may be connected to each of the first latch 134a and the second latch 134b. The locking of the first latch 134a may be released by pulling the connection member 136c connected to the first latch 134a, and the locking of the second latch 134b may be released by pulling the connection member 136c connected to the second latch 134b.

The elastic member 136b may provide the connection member 136c to the elastic force and include a spring. Consequently, when the pulling force is removed from the connection member 136c, the first latch 134a and/or the second latch 134b, which are/is connected to the connection member(s) 136c from which the pulling force has been removed, may be inserted into and locked to the latch groove(s) 135a (again).

Here, the latch driver 136 may further include a handle 136a connected to the connection member 136c. The handle 136a may be connected to the other end of the connection member 136c and used to pull the connection member 136c, and the connection member 136c may be pulled by moving the handle 136a. Here, when the connection member 136c includes a plurality of wires, the other end of each of the plurality of wires may be connected to the handle 136a. Each of the plurality of wires may be pulled by the movement of the handle 136a.

In this case, the elastic member 136b provides an elastic force to the handle 136a, and the elastic force may be transmitted to the connection member 136c. For example, the elastic member 136b may provide the elastic force to the handle 136a and return the moved handle 136a to its original position. That is, as the connection member 136c is pulled by moving the handle 136a while compressing the elastic member 136b such as a spring, the locking of the first latch 134a and/or the second latch 134b may be released. Also, as the moved handle 136a is returned to its original position by removing the pressure applied to the elastic member 136b, the first latch 134a and/or the second latch 134b may be inserted into and locked to the latch groove(s) 135a (again).

In addition, the latch driver 136 may further include a roller 136d for guiding the movement of the connection member 136c. The roller 136d may be in contact with the surface of the connection member 136c and guide the movement of the connection member 136c. Accordingly, the connection member 136c is pulled and released by the movement of the handle 136a, and thus, the first latch 134a and the second latch 134b may be smoothly locked and released. Here, the roller 136d may serve to change the direction of force, and may prevent excessive force from being applied to the connection member 136c, thereby preventing damage to the connection member 136c such as breakage.

When pressure is applied to the elastic member 136b and the handle 136a is moved in the direction in which the elastic member 136b is compressed, the connection member 136c is pulled in the moving direction of the handle 136a. Then, the first latch 134a and/or the second latch 134b connected to the connection member 136c may be pulled, and locking of the first latch 134a and/or the second latch 134b may be released. Consequently, the other side of the first connection portion 131 and the one side of the second connection portion 132 may be moved, the bending support unit 120 may be bent, and the radiation detecting panel 110 may be bent. After the radiation detecting panel 110 is bent to a desired curvature (or a predetermined curvature), the pressure applied to the elastic member 136b is released. Accordingly, as the first latch 134a and/or the second latch 134b are/is locked (again), the bending state of the radiation detecting panel 110 may be maintained.

Also, after the radiographic testing (RT) is completed, the handle 136a is moved in a direction in which the elastic member 136b is compressed. For this, when the pressure is applied to the elastic member 136b, the connection member 136c may be pulled according to the movement of the handle 136a. Then, the first latch 134a and/or the second latch 134b connected to the connection member 136c may be pulled, and locking of the first latch 134a and/or the second latch 134b may be released. Consequently, the other side of the first connection portion 131 and the one side of the second connection portion 132 may be moved, and the radiation detecting panel 110 may be restored to its original state as the bending support unit 120 is unfolded (again). Subsequently, when the pressure applied to the elastic member 136b is removed, the handle 136a returns to its original position due to the elasticity of the elastic member 136b, and the pulling force may be released from the pulled connection member 136c. Then, the first latch 134a and/or the second latch 134b connected to the connection member 136c are/is moved in a direction so as to be inserted into the latch groove 135a, and the first latch 134a and/or the second latch 134b may be inserted into and locked to the latch groove(s) 135a. Accordingly, the positions of the other side of the first connection portion 131 and the one side of the second connection portion 132 are fixed, and thus, the radiation detecting panel 110 may maintain its original state (or unfolded state).

Meanwhile, the latch driver 136 may also adjust the locking positions of the first latch 134a and the second latch 134b with respect to the plurality of latch grooves 135a. After the locking of the first latch 134a and/or the second latch 134b is released, the latch driver 136 moves the released first latch 134a and/or the released second latch 134b. Accordingly, the locking positions of the first latch 134a and the second latch 134b may be (automatically) adjusted, and the first latch 134a and the second latch 134b may be inserted into and locked to respective ones of the plurality of latch grooves 135a.

Figure 4:
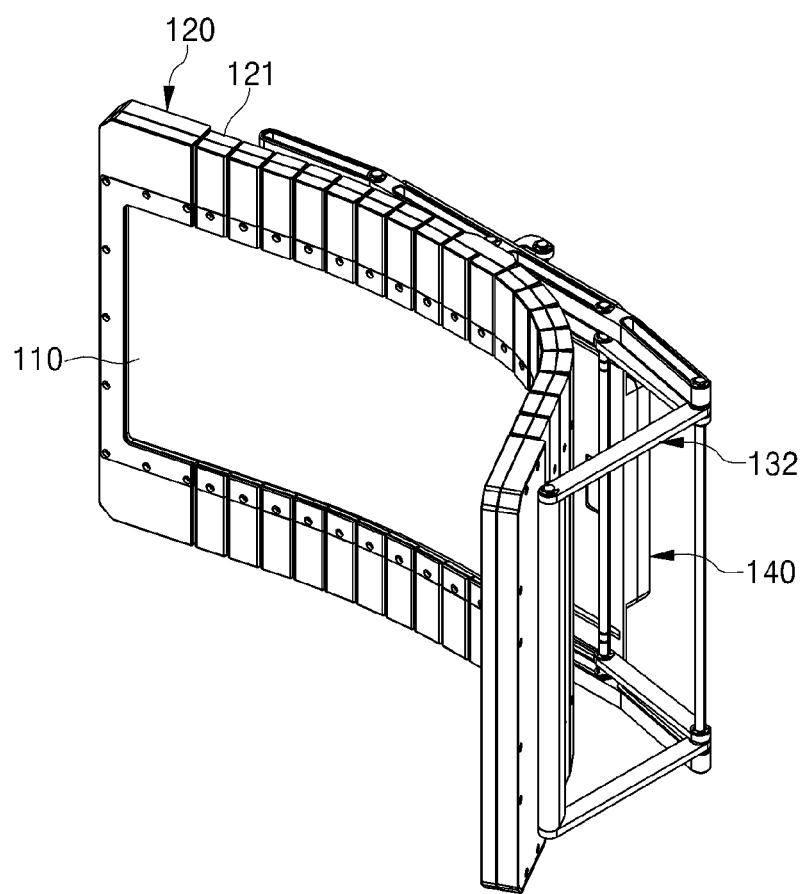
FIG. 4 is a view showing a second modified example of a radiation detector according to an embodiment of the present inventive concept.
Figure 5:
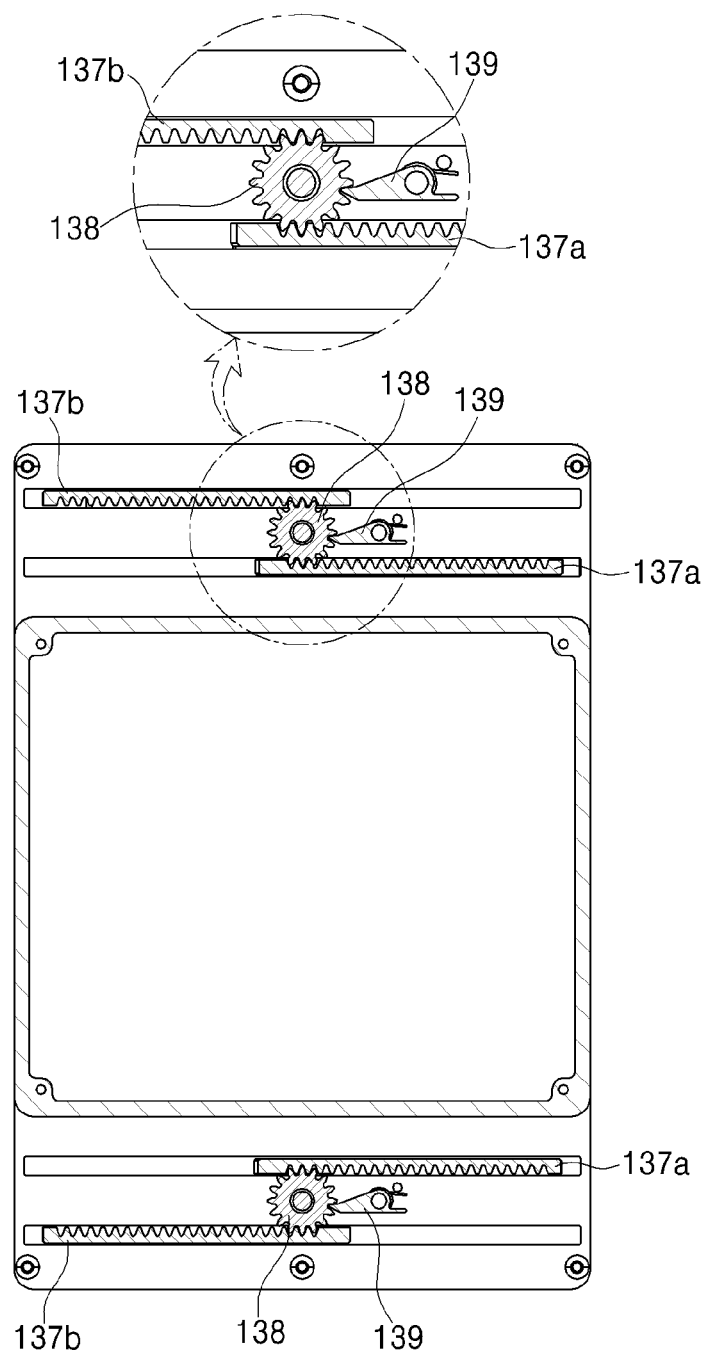
FIG. 5 is a partial cross-sectional view of the second modified example of the radiation detector according to an embodiment of the present inventive concept.

FIG. 4 is a view showing a second modified example of a radiation detector according to an embodiment of the present inventive concept, and FIG. 5 is a partial cross-sectional view of the second modified example of the radiation detector according to an embodiment of the present inventive concept.

Referring to FIGS. 4 and 5, the bending adjustment unit 130 may further include: a first moving gear 137a connected to the other side of the first connection portion 131; a second moving gear 137b connected to the one side of the second connection portion 132; and a driving gear 138 engaging respectively with the first moving gear 137a and the second moving gear 137b, thereby moving the first moving gear 137a and the second moving gear 137b. The first moving gear 137a may be connected to the other side of the first connection portion 131 and moved by the driving gear 138 to move the other side of the first connection portion 131.

The second moving gear 137b may be connected to the one side of the second connection portion 132 and moved by the driving gear 138 to move the one side of the second connection portion 132.

The driving gear 138 may engage with each of the first moving gear 137a and the second moving gear 137b, and may move the first moving gear 137a and the second moving gear 137b. The first moving gear 137a may move in engagement with the driving gear 138, and the second moving gear 137b may move in engagement with the driving gear 138.

The one side of the first connection portion 131 is connected to the one side of the bending support unit 120. Therefore, when the other side of the first connection portion 131 is moved in a direction closer to the one side of the bending support unit 120 by the movement of the first moving gear 137a, the one side of the first connection portion 131 does not move in a direction parallel to the movement direction of the other side of the first connection portion 131, but pushes up the one side of the bending support unit 120. Accordingly, the one side of the bending support unit 120 may be bent. Also, the other side of the second connection portion 132 is connected to the other side of the bending support unit 120. Therefore, when the one side of the second connection portion 132 is moved in a direction closer to the other side of the bending support unit 120 by the movement of the second moving gear 137b, the other side of the second connection portion 132 does not move in a direction parallel to the movement direction of the one side of the second connection portion 132, but pushes up the other side of the bending support unit 120. Accordingly, the other side of the bending support unit 120 may be bent. Therefore, both sides of the bending support unit 120 in the first direction may be bent by the movement(s) of the first moving gear 137a and/or the second moving gear 137b, and thus, the radiation detecting panel 110 may be easily bent. A degree of bending of the radiation detecting panel 110 may be adjusted depending on the movement distance(s) of the first moving gear 137a and/or the second moving gear 137b.

For example, the first moving gear 137a and the second moving gear 137b may be rack gears, and the driving gear 138 may be a pinion gear. Each of the first moving gear 137a and the second moving gear 137b may be moved along the rotation direction of the driving gear 138 by the rotation of the driving gear 138. Here, the driving gear 138 may be rotated by a motor. The first moving gear 137a and the second moving gear 137b may be moved automatically by mechanical operation, and thus, the bending of the radiation detecting panel 110 may be adjusted. Here, the bending adjustment unit 130 may further include a pawl 139 for limiting (or preventing) the rotation of the driving gear 138. The pawl 139 may limit rotation of the driving gear 138 and may prevent reverse rotation (e.g., counterclockwise rotation) of the driving gear 138. Here, the reverse rotation of the driving gear 138 may be a rotation for causing the bending support unit 120 to unfold (again). Consequently, after the radiation detecting panel 110 is bent to a desired curvature, the bending state of the radiation detecting panel 110 may be maintained.

When the driving gear 138 rotates forward (e.g., clockwise rotation), the first moving gear 137*a* and the second moving gear 137*b* are moved in directions closer to one side and the other side of the bending support unit 120, respectively. Accordingly, the radiation detecting panel 110 may be bent to a desired curvature. Here, when the rotatory force for rotating the driving gear 138 forward is removed, the bending support unit 120 is unfolded by elasticity of the bending support unit 120. Accordingly, the first moving gear 137*a* and the second moving gear 137*b* may move in directions away from the one side and the other side of the bending support unit 120, respectively, and the driving gear 138 may rotate in reverse. Accordingly, after the radiation detecting panel 110 is bent to a desired curvature, reverse rotation of the driving gear 138 may be prevented by the pawl 139. Accordingly, the bending state of the radiation detecting panel 110 bent to a desired curvature (or a certain curvature) may be maintained at a certain curvature. Also, when the engagement of the pawl 139 engaging with the driving gear 138 is released by a separate operation handle, an external pin, or the like, the driving gear 138 is rotated in reverse by the elasticity of the bending support unit 120, and the bending support unit 120 may be unfolded. Accordingly, the radiation detecting panel 110 may also be unfolded and restored to its original state.

Meanwhile, a servo-motor may be used as a motor for rotating the driving gear 138. Since the servo-motor may control mechanical load, the driving gear 138 may be allowed to rotate only when a driving signal for rotation is input to the servo-motor. In a stationary state in which a driving signal is not input to the servo-motor, rotation of the driving gear 138 due to the load may be prevented. Accordingly, it is possible to prevent the bending support unit 120 from being unfolded (again) by the elasticity of the bending support unit 120, and thus, the radiation detecting panel 110 may maintain a bent state.

In addition, a bending force may be manually applied to one side and/or the other side of the bending support unit 120 in the first direction so as to bend the bending support unit 120. Even when the first moving gear 137*a*, the second moving gear 137*b*, and the driving gear 138 are linked so as to provide the bending force only to one (or one side or the other side) of both sides of the bending support unit 120 in the first direction, both sides of the bending support unit 120 in the first direction are simultaneously bent to form curvatures having the same angle. Here, each of the first connection portion 131 and the second connection portion 132 may have a multi-link structure. This structure may be satisfied if the bending force can be equally well transmitted to both sides of the bending support unit 120 in the first direction by the first moving gear 137*a*, the second moving gear 137*b*, and the driving gear 138.

Accordingly, the bending support unit 120 having elasticity is bent by the first connection portion 131 and the second connection portion 132 respectively connected to both sides of the bending support unit 120, and thus, the radiation detecting panel 110 may be easily bent. In addition, the bending support unit 120 and the radiation detecting panel 110 may be maintained at a certain angle in a bent state. That is, the radiation detector 100 according to the present inventive concept may maintain the bending state of the radiation detecting panel 110 at a certain angle when the radiation detecting panel 110 is bent. In addition, when the radiation detecting panel 110 is bent (or deformed) by external pressure, the radiation detecting panel 110 may not be damaged.

The radiation detector 100 according to the present inventive concept may further include a housing 150 which accommodates the radiation detecting panel 110 and has a radiation-transmissive region 150*a* on a face facing the radiation detecting panel 110.

The housing 150 may accommodate the radiation detecting panel 110, protect the radiation detecting panel 110 from external impacts and loads, and have the radiation-transmissive region 150*a* on the face facing the radiation detecting panel 110 so that the radiation may be incident (or transmitted) to the radiation detecting panel 110.

For example, the housing 150 may include a frame and a radiation transmitting plate which is supported by the frame and provided on the first face of the radiation detecting panel 110. The frame is for protecting component(s) of the radiation detecting panel 110 and the like accommodated in the housing 150, and may include thermally conductive metal such as copper, aluminum, stainless steel, or the like having mechanical strength.

The radiation transmitting plate may be positioned on a face on which the radiation is incident, and may mitigate an impact from the outside. Moreover, the radiation transmitting plate may include a material having a very high radiation transmission rate and/or a material having a very low radiation absorption rate. For example, the radiation transmitting plate may include a protective material such as a carbon material having a strong strength so as to protect the radiation detecting panel 110 and having a low radiation shielding rate. The radiation transmitting plate may include carbon, carbon fiber, a carbon compound, glass fiber, a composite material including glass fiber, polycarbonate, a polycarbonate compound, or the like. Here, the radiation transmitting plate may have flexibility and/or elasticity (i.e., restoring force) and protect the radiation detecting panel 110 from external impacts and loads, and may be a protective material having a low radiation energy shielding rate.

Also, the housing 150 may be fixed in a state in which the radiation detecting panel 110 is bent, and accordingly, the bending (state) of the radiation detecting panel 110 bent by the bending adjustment unit 130 may be fixed at a certain curvature.

Figure 6:
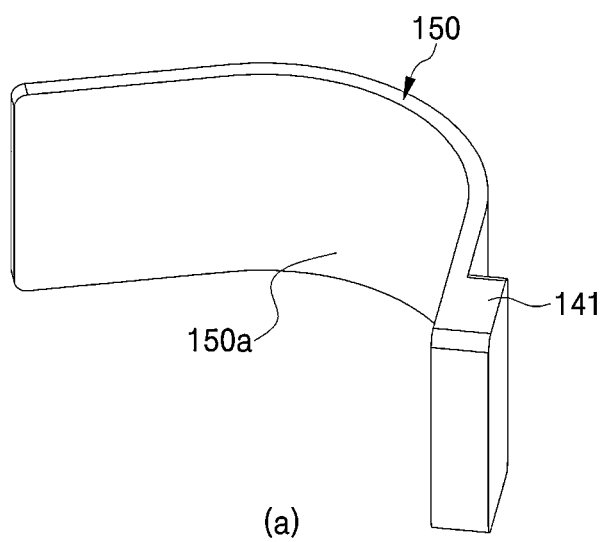
FIG. 6 is a perspective view showing a housing having a curved radiation-transmissive region according to an embodiment of the present inventive concept.
Figure 6:
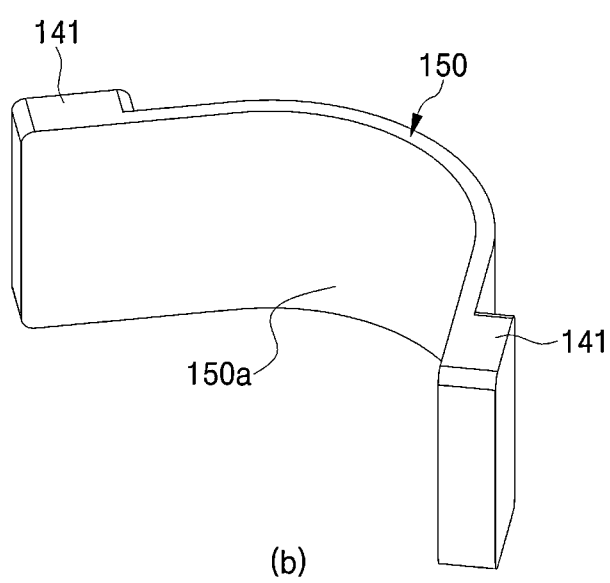

FIG. 6 is a perspective view showing a housing having a curved radiation-transmissive region according to an embodiment of the present inventive concept. (a) of FIG. 6 shows a housing having an electronic component box on one side, and (b) of FIG. 6 shows a housing having electronic component boxes on both sides.

Referring to FIG. 6, the radiation-transmissive region 150*a* of the housing 150 may include a curved surface, and the radiation detecting panel 110 may be bent along the curved radiation-transmissive region 150*a* and fixed to the housing 150. The radiation-transmissive region 150*a* of the housing 150 may include a curved surface, and the radiation detecting panel 110 may be bent and provided along the curved surface. Here, the radiation detecting panel 110 may be bent along the radiation-transmissive region 150*a* of the curved surface and fixed to the housing 150 in the bent state. Also, the bending state thereof may be fixed at a certain curvature.

For example, the housing 150 may have a curved shape which is bent about a bending axis parallel to the second direction, and may be formed corresponding to the curved surfaces of subjects 10 that have curved surfaces (shapes) of various curvatures such as a pipe, a ship, an airplane, a facility, and equipment. Here, the curved shape of the housing 150 may have various shapes from a gentle bending shape to a bending shape sufficient to cover the entire outer diameter of a circular subject 10 such as a pipe. Here, the housing 150 may be integrally formed, or may have an assembly type in which each part such as the radiation-transmissive region 150a is assembled.

The housing 150 may serve as a case and formed so as to fix a state in which the radiation detecting panel 110 is bent, and the housing may be mounted or coupled in a state in which the radiation detecting panel 110 is bent. Here, the radiation detecting panel 110 may be mounted and/or located inside the housing 150 in a bent state. That is, the housing 150 may serve to fix the bent radiation detecting panel 110 in a bent state therein.

Meanwhile, the housing 150 may be formed with various curvatures so that the radiation detecting panel 110 is bent to a curvature corresponding to or covering the curved surfaces (portions) of the various subjects 10 having various curvatures. Also, the housing may be replaced with a housing 150 having an appropriate curvature according to the curved surface of the subject 10 to be tested. Here, the housing 150 may be formed in an insertion type for easy replacement, and the radiation detecting panel 110 supported by the bending support unit 120 may be inserted from one side of the housing 150 in the first direction and mounted inside the housing 150. Here, the bending support unit 120 may guide mounting (or insertion) of the radiation detecting panel 110 so that the radiation detecting panel 110 to be inserted into the housing 150 is inserted along the curved radiation-transmissive region 150a without wrinkling.

Figure 7:
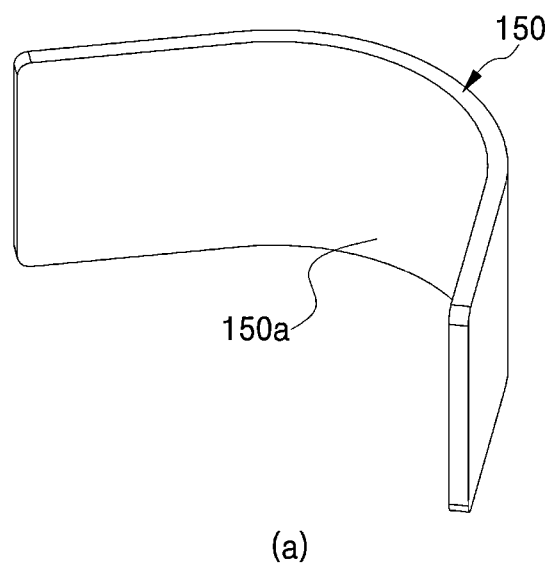
FIG. 7 is a conceptual view for explaining the inside of a housing having a curved radiation-transmissive region according to an embodiment of the present inventive concept.
Figure 7:
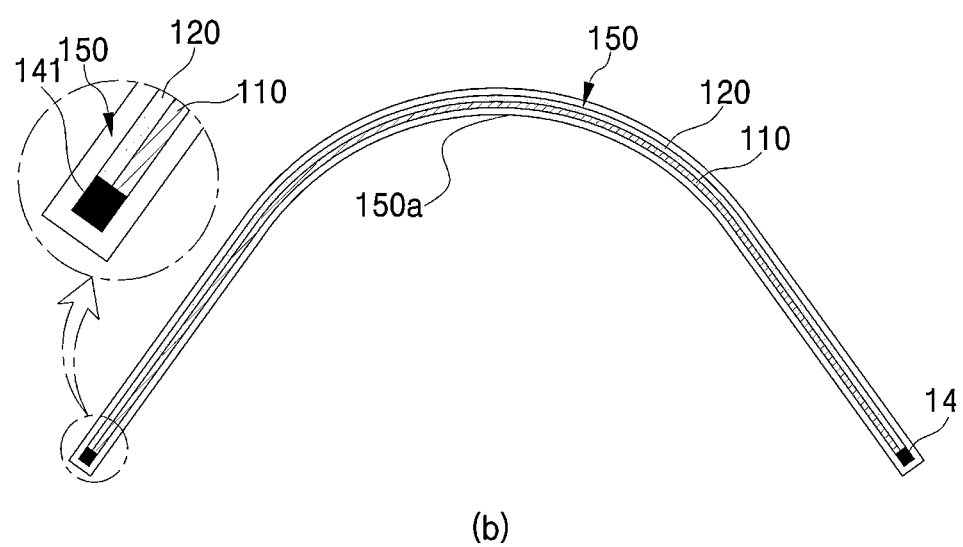

FIG. 7 is a conceptual view for explaining the inside of a housing having a curved radiation-transmissive region according to an embodiment of the present inventive concept. (a) of FIG. 7 shows a perspective view of the radiation detector, and (b) of FIG. 7 shows a cross-sectional view of the radiation detector.

Referring to FIG. 7, the housing 150 may include an electronic component box 141 in which an electronic circuit for driving the radiation detecting panel 110 is mounted, on one side in the first direction. That is, the housing 150 may have the electronic component box 141 at least on one side in the first direction, and the electronic component box may protrude to the outside of the housing 150 or may be provided inside the housing 150 and located on at least one side of the radiation detecting panel 110 in the first direction. An electronic circuit for driving the radiation detecting panel 110 may be mounted in the electronic component box 141, and the electronic component box may be provided at least on one side of the housing 150 in the first direction or may be provided on both sides of the housing 150 in the first direction. Here, the electronic component box 141 provided on one side of the housing 150 in the first direction may protrude to the outside of the housing 150, or the electronic component provided on the other side of the housing 150 in the first direction may be provided inside the housing 150. It is sufficient if the electronic component box is connected to the radiation detecting panel 110 on at least one side of the radiation detecting panel 110 in the first direction.

Also, the radiation detector 100 according to the present inventive concept may further include: a finishing material that prevents light, foreign substances, and the like from flowing in component(s), accommodated inside the housing 150, from the outside; and a signal transmission unit 161 for transmitting a signal of the radiation detecting panel 110.

The finishing material may have elasticity, and may include a rubber material such as silicon or urethane. For example, the finishing material may be a gasket-type finishing material that prevents the inflow of external light and foreign substances, and may have a shape and material that is freely deformed due to external pressure. Here, the finishing material may be a silicone or phorone gasket.

Here, in the radiation detector 100 according to the present inventive concept, when examining the coupling structure of the radiation transmitting plate, a radiation detecting panel 110, the finishing material, an intermediate plate 120 such as a reinforcing plate 122, and a plurality of folding plates 121, the radiation transmitting plate and the plurality of folding plates 121 may be attached to each other by adhesive tape or coupled (assembled) to each other through bolt coupling. Also, the radiation detecting panel 110, the finishing material, and the intermediate plate 120 may be provided between the radiation transmitting plate and the plurality of folding plates 121. For example, the edges (portions) of the radiation transmitting plate and the plurality of folding plates 121 may be coupled to each other, and the radiation detecting panel 110, the finishing material, and the intermediate plate 120 may be disposed in the center (portion) between the radiation transmitting plate and the plurality of folding plates 121. Here, the intermediate plate 120 may be provided adjacent to the plurality of folding plates 121, and the radiation detecting panel 110 and the finishing material may be supported thereby. The finishing material may be provided around the radiation detecting panel 110, and the radiation detecting panel 110 may be provided such that the first face thereof faces the radiation transmitting plate. In this structure, the radiation detecting panel 110, the finishing material, and the intermediate plate 120 are not directly fixed to the radiation transmitting plate and/or the plurality of folding plates 121. Therefore, during bending, each part may be freely bent at its own curvature, and tearing and damage due to friction may not occur.

The signal transmission unit 161 may transmit a signal of the radiation detecting panel 110 and transmit (or deliver) an electrical signal, which is delivered (or extracted) from the radiation detecting panel 110, to the radiation detecting system provided (or mounted) to the body unit 140. Also, the signal transmission unit may process the electrical signal. For example, the signal transmission unit 161 may include a case in which a system (e.g., electronic circuit) for delivering and/or processing the electrical signal is mounted. Here, the signal transmission unit 161 is provided on the second face of the radiation detecting panel 110 and may be located at each of between the bending support unit 120 and the first connection portion 131 and between the bending support unit 120 and the second connection portion 132. One side of the first connection portion 131 may be indirectly connected to one side of the bending support unit 120 by the signal transmission unit 161, and the other side of the second connection portion 132 may be indirectly connected to the other side of the bending support unit 120 by the signal transmission unit 161.

Also, the radiation detector 100 according to the present inventive concept may be equipped with a battery and a wireless antenna. Accordingly, driving of the radiation detecting panel 110 and transmission of the radiographic image may be possible without a separate input cable, and a wired/wireless type may be used depending on the purpose. Here, the battery may be charged in both wired and wireless manner.

Figure 8:
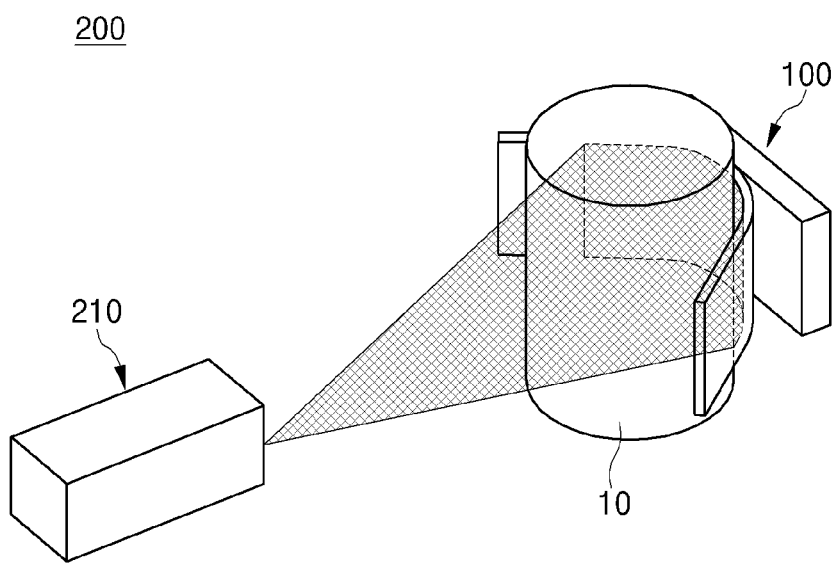
FIG. 8 is a perspective view showing a radiation inspection apparatus according to another embodiment of the present inventive concept.

FIG. 8 is a perspective view showing a radiation inspection apparatus according to another embodiment of the present inventive concept.

The radiation inspection apparatus according to another embodiment of the present inventive concept will be described in more detail with reference to FIG. 8, but descriptions duplicated with those described above with respect to the radiation detector according to an embodiment of the present inventive concept will be omitted.

A radiation inspection apparatus 200 according to another embodiment of the present inventive concept may include: a radiation generating unit 210 for irradiating a subject 10 with radiation; and the radiation detector 100 according to an embodiment of the present inventive concept, which detects the radiation that passes through the subject 10.

The radiation generating unit 210 may irradiate the subject 10 with radiation, and the radiation emitted to the subject 10 may pass through the subject 10 and is incident to the first face of the radiation detecting panel 110.

The radiation detector 100 may be the radiation detector 100 according to an embodiment of the present inventive concept, and may acquire image information by detecting the radiation that has passed through the subject 10. Here, the radiation detector 100 may be a digital radiography (DR) detector that acquires image information by electrically detecting radiation through a semiconductor sensor or the like without a film.

The subject 10 may be disposed between the radiation generating unit 210 and the radiation detector 100. The bending adjustment unit 130 may be provided so as to adjust bending of the radiation detecting panel 110 according to the curvature of the surface of the subject 10 that faces the radiation detecting panel 110. That is, the subject 10 is located between the radiation generating unit 210 and the radiation detector 100, the radiation generating unit 210 emits the radiation toward the subject 10, and the radiation detector 100 detects the radiation that has passed through the subject 10. Accordingly, a radiographic image of the subject 10 may be obtained. By using this obtained radiographic image, it is possible to check the presence or absence and states of defects (e.g., pores, slag mixing, cracks, poor fusion, incomplete penetration, root concavities, undercuts, etc.) on the surface and/or inside of the subject 10, the characteristics and internal structure of the subject 10, and the like.

Here, the bending of the radiation detecting panel 110 may be adjusted by the bending adjustment unit 130, and the bending of the radiation detecting panel 110 may be adjusted to conform to the curvature of the surface of the subject 10 that faces the radiation detecting panel 110. Accordingly, even in a subject 10 having a curved surface, such as a pipe, inspection may be possible without image distortion.

That is, during the non-destructive inspection for cracks that may occur in various types of structures (or the subject) or foreign substances that may be included in streamlined food (or the subject) such as cans, an image having superior quality may be obtained by utilizing the bendable characteristics of the radiation detecting panel 110, compared to an image from a flat panel-type radiation detector according to the related art.

Accordingly, an inspection set-up process using the radiation detector 100 may be simplified, and unnecessary equipment and accessories may be reduced. Therefore, the work efficiency of a user (or operator) may be improved. In addition, more accurate image acquisition and evaluation may be expected through acquisition of non-distorted and wide regional (radiographic) image.

As described above, according to the present inventive concept, the bending support unit having less flexibility than the flexible radiation detecting panel may support the radiation detecting panel, guide the bending of the radiation detecting panel, and help the radiation detecting panel to maintain a bent state. Also, the bending of the radiation detecting panel may be adjusted by using the bending adjustment unit connected to the bending support unit, the radiation detecting panel may be bent to form a certain curved surface, and the curved state may be maintained at a certain angle. Therefore, it is possible to rapidly acquire radiographic images of various subjects having various curvatures. Accordingly, an image without distortion may be acquired in real time for the subject having any curvature, and the examination and diagnosis may be directly read on site using the acquired image having excellent quality. That is, during the non-destructive inspection for cracks that may occur in various types of structures or foreign substances that may be included in streamlined food such as cans, an image having superior quality may be obtained by utilizing the bendable characteristics of the radiation detecting panel, compared to an image from a flat panel-type radiation detector according to the related art. In addition, the radiation detecting panel is formed based on a flexible organic semiconductor and easily enlarged, and thus may simultaneously solve the limitations of high price and low yield due to a complicated process, which are chronic limitations of a flat panel-type radiation detector according to the related art. This makes it possible to commercialize a high-performance, large-scale digital radiography detector. In addition, the radiation is converted into electrical signals in the radiation detecting panel by using organic material technology. Accordingly, as the radiation detecting panel having a low driving voltage is developed, the production cost is reduced, and the thin and lightweight radiation detector may be manufactured through a low voltage circuit design. Moreover, the plurality of folding plates may prevent the radiation detecting panel from being sharply bent and damaged, and each pixel in the radiation detecting panel may be allowed to remain flat without being bent as much as possible. Accordingly, the bending support unit having elasticity is bent by the first connection portion and the second connection portion respectively connected to both sides of the bending support unit, and thus, the radiation detecting panel may be easily bent. In addition, the bending support unit and the radiation detecting panel may be maintained at a certain angle in a bent state. Furthermore, the bending of the radiation detecting panel may be fixed by using the housing formed in a curved surface. Also, various housings having curved surfaces determined according to various subjects may be provided, and these housings may be replaced with housings having appropriate curved surfaces according to the subjects.

Although the present inventive concept has been described with reference to the specific embodiments, it is not limited to thereto. Therefore, it will be readily understood by those skilled in the art that various modifications and changes can be made thereto without departing from the spirit and scope of the present inventive concept defined by the appended claims. Hence, the technical protective scope of the present inventive concept should be determined by the accompanying claims.

The invention claimed is:

1. A radiation detector comprising:
   a radiation detecting panel, which is flexible, extending in a first direction, and detecting radiation incident to a first face; and a bending support unit, which is plate-shaped, provided on a second face of the radiation detecting panel opposite to the first face to support the radiation detecting panel, and having a flexibility; and a bending adjustment unit, which is connected to the bending support unit and adjusts bending of the radiation detecting panel with respect to a bending axis parallel to a second direction crossing the first direction, wherein the flexibility of the bending support unit is less than a flexibility of the radiation detecting panel.

2. The radiation detector of claim 1, further comprising a plurality of folding plates provided on the second face of the radiation detecting panel, extending in the second direction and arranged in the first direction.

3. The radiation detector of claim 2, further comprising a body unit to which at least a portion of the plurality of folding plates are fixed, wherein the radiation detecting panel is bent with respect to the body unit.

4. The radiation detector of claim 3, wherein the body unit comprises an electronic component box.

5. The radiation detector of claim 1, wherein the bending adjustment unit comprises:

a first connection portion connected at a first side of the bending support unit; and a second connection portion connected at a second side of the bending support unit opposite the first side of the bending support unit.

6. The radiation detector of claim 5, wherein the bending adjustment unit further comprises a first hinge and a second hinge, which are spaced apart from each other, and to which the first connection portion and the second connection portion are respectively connected, wherein the first connection portion rotates about the first hinge as a rotation axis, and the second connection portion rotates about the second hinge as a rotation axis.

7. The radiation detector of claim 6, wherein each of the first hinge and the second hinge has a hinge disc.

8. The radiation detector of claim 5, wherein an end of the first connection portion and an end of the second connection portion are movable to adjust a distance between each other.

9. The radiation detector of claim 8, wherein the bending adjustment unit further comprises:

a first latch provided on the end of the first connection portion;

a second latch provided on the end of the second connection portion; and a plurality of latch grooves arranged in movement directions of the ends of the first connection portion and the second connection portion.

10. The radiation detector of claim 9, wherein the bending adjustment unit further comprises a latch driver that adjusts locking and releasing of the first latch and the second latch.

11. The radiation detector of claim 10, wherein the latch driver comprises:

a connection member connected to the first latch and the second latch, respectively; and an elastic member configured to provide an elastic force to the connection member.

12. The radiation detector of claim 8, wherein the bending adjustment unit further comprises:

a first moving gear connected to the end of the first connection portion;

a second moving gear connected to the end of the second connection portion; and a driving gear configured to engage respectively with the first moving gear and the second moving gear to move the first moving gear and the second moving gear.

13. The radiation detector of claim 1, further comprising a housing, which accommodates the radiation detecting panel and has a radiation-transmissive region on a face facing the radiation detecting panel.

14. The radiation detector of claim 13, wherein the radiation-transmissive region of the housing comprises a curved surface, and the radiation detecting panel is bent along the radiation-transmissive region of the curved surface and fixed to the housing.

15. The radiation detector of claim 14, wherein the housing comprises an electronic component box on one side in the first direction.

16. A radiation inspection apparatus comprising:

a radiation generating unit configured to irradiate a subject with radiation; and the radiation detector of claim 1, which detects the radiation that passes through the subject.

17. The radiation inspection apparatus of claim 16, wherein the subject is disposed between the radiation generating unit and the radiation detector, and the bending adjustment unit is configured to adjust bending of the radiation detecting panel according to a curvature of a surface of the subject that faces the radiation detecting panel.

\* \* \* \* \*